United States Patent
Jacques et al.

(10) Patent No.: US 11,906,566 B2
(45) Date of Patent: Feb. 20, 2024

(54) SYSTEM FOR MONITORING THE STATE OF A CABLE THROUGH DISTRIBUTED TRANSFEROMETRY

(71) Applicant: COMMISSARIAT A L'ENERGIE ATOMIQUE ET AUX ENERGIES ALTERNATIVES, Paris (FR)

(72) Inventors: Marie-Bénédicte Jacques, Gif sur Yvette (FR); Cyril Chastang, Meudon (FR); Alain Giraud, Orsay (FR); Nicolas Ravot, Gif sur Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/772,495

(22) PCT Filed: Oct. 13, 2020

(86) PCT No.: PCT/EP2020/078665
§ 371 (c)(1),
(2) Date: Apr. 27, 2022

(87) PCT Pub. No.: WO2021/083655
PCT Pub. Date: May 6, 2021

(65) Prior Publication Data
US 2022/0341984 A1 Oct. 27, 2022

(30) Foreign Application Priority Data

Oct. 29, 2019 (FR) ........................................ 1912140

(51) Int. Cl.
*G01R 31/08* (2020.01)
*H02H 7/26* (2006.01)

(52) U.S. Cl.
CPC ........... *G01R 31/085* (2013.01); *H02H 7/265* (2013.01)

(58) Field of Classification Search
CPC ...... G01R 31/08; G01R 31/085; H02H 1/003; H02H 5/10; H02H 7/265
See application file for complete search history.

(56) References Cited

U.S. PATENT DOCUMENTS

| 5,153,874 A | * | 10/1992 | Kohno | ...................... H04L 1/22 375/360 |
| 2010/0315092 A1 | * | 12/2010 | Nacson | .................. G01R 31/52 324/510 |
| 2014/0222356 A1 | | 8/2014 | Incarbone | |

OTHER PUBLICATIONS

Auzanneau, "Transferometry: A New Tool for Complex Wired Networks Diagnosis", Progress in Electromagnetics Research B, vol. 70, 2016.

* cited by examiner

*Primary Examiner* — Michael J Dalbo
(74) *Attorney, Agent, or Firm* — BakerHostetler

(57) ABSTRACT

A system for monitoring the state of a cable, includes a plurality of transferometry devices capable of injecting a test signal into the cable and measuring a signal being propagated in the cable, the transferometry devices being positioned along the cable so as to break down the cable into successive sections, the system comprising a control member capable of communicating with the transferometry devices and configured so as to perform at least one transferometry test consisting in injecting a test signal into the cable by means of a first transferometry device and measuring the test signal after its propagation in the cable by means of a second transferometry device different from the first device, the system comprising a post-processing member capable of communicating with the transferometry devices and configured to compare the measured signal to a (Continued)

reference signal to deduce therefrom an indicator of degradation of the section of cable disposed between the first transferometry device and the second transferometry device.

16 Claims, 2 Drawing Sheets

SYSTEM FOR MONITORING THE STATE OF A CABLE THROUGH DISTRIBUTED TRANSFEROMETRY

CROSS-REFERENCE TO RELATED APPLICATIONS

This application is a National Stage of International patent application PCT/EP2020/078665, filed on Oct. 13, 2020, which claims priority to foreign French patent application No. FR 1912140, filed on Oct. 29, 2019, the disclosures of which are incorporated by reference in their entirety.

FIELD OF THE INVENTION

The invention relates to the field of the monitoring of the state of cables of great lengths, for example submarine cables, power line cables or communication cables. More generally, the invention applies to any cable exhibiting a significant attenuation for a signal being propagated from one end of the cable to the other.

BACKGROUND

A general objective of the invention is to provide a solution that makes it possible to assess the state of degradation or of aging of a cable of very great length or exhibiting strong attenuation.

Among the known solutions that make it possible to diagnose the state of health of a cable, the methods based on reflectometry make it possible to detect the appearance of faults on the cables or cable networks. These methods are based on the injection of a test signal into the cable to be analyzed. The signal is reflected on the impedance discontinuity caused by the fault and then is back-propagated to the injection point where it is measured. The analysis of the reflected signal makes it possible to detect an amplitude peak corresponding to the fault. The electrical signature can, for example, take the form of an amplitude peak. Some reflectometry methods also make it possible to locate the fault.

There are various reflectometry methods that exist, based on analyses in the time or frequency domain with test signals of various natures (pulsed, multi-carrier or more complex).

One drawback of the known reflectometry methods is that they are not suited to cables for which the attenuation and the dispersion of the signal are too great beyond a certain distance. The influence of the attenuation is all the more important as a reflectometry test requires the signal to follow a go and return path, which doubles the attenuation factor.

There is therefore a need for a system for analyzing the state of degradation of a cable of very great length or of high attenuating cables.

Also known is the method described in the scientific publication "Transferometry: a new tool for complex wired networks diagnosis, F. Auzanneau, Progress in Electromagnetics Research B, vol 70, 87-100, 2016". This document describes a method for detecting faults by transferometry for complex cable networks by positioning a sensor at each end of the network. The proposed method does not address the issue of monitoring a single cable of very great length.

SUMMARY OF THE INVENTION

The invention proposes a solution which makes it possible to monitor the degradation of a cable of very great length through a monitoring system composed of several sensors distributed along the cable and linked to a control member by means of a communication link. The control member drives the various sensors to perform the tests for each section of the cable by using a transferometry analysis method.

The invention resolves the problems of attenuation of the signal through a multi-sensor system which makes it possible to perform tests by cable sections. Thus, the path of the signal injected into the cable and then measured is reduced. Moreover, the invention uses a transferometry analysis method which uses only the forward path of the signal and not the reflected path, which makes it possible to further limit the impact of the attenuation of the signal on the analysis.

The subject of the invention is a system for monitoring the state of a cable, the system comprising a plurality of transferometry devices each being capable of injecting a test signal at an injection point of the cable and measuring a signal being propagated in the cable at a measurement point of the cable, the transferometry devices being intended to be positioned along the cable at predetermined positions so as to break down the cable into successive sections, the system comprising a control member capable of communicating with the transferometry devices and configured so as to perform at least one transferometry test consisting in injecting a test signal into the cable by means of a first transferometry device and measuring the test signal after its propagation in the cable by means of a second transferometry device different from the first device, the system further comprising a post-processing member capable of communicating with the transferometry devices and configured to compare the measured signal to a reference signal to deduce therefrom an indicator of a degradation of the cable section disposed between the first transferometry device and the second transferometry device.

According to a particular aspect of the invention, the control member is configured to control, according to a predefined test procedure, each transferometry device by activating or deactivating the injection of a test signal into the cable by means of said device and by activating or deactivating the acquisition of a measurement of a signal being propagated in the cable by means of said device.

According to a particular aspect of the invention, the test procedure consists in successively executing the following commands:
  activating the injection of a test signal by a first transferometry device situated at the start of a first section of the cable,
  activating the acquisition of a signal measurement by a second transferometry device disposed at the end of the first section,
  after a first predetermined monitoring period, deactivating the injection of a test signal by the first device, deactivating the acquisition of a measurement by the second device,
  after a second predetermined timer period, reiterating the preceding steps for the subsequent sections of the cable.

According to a particular aspect of the invention, the first monitoring period is predetermined as a function of the speed of propagation of the signal in the cable and of the distance between two consecutive transferometry devices.

According to a particular aspect of the invention, the second timer period is predetermined as a function of the speed of propagation of the signal in the cable and of a signal attenuation factor.

According to a particular aspect of the invention, the control member is configured to simultaneously activate several transferometry tests for several sections of the cable spaced apart from one another by a distance predetermined as a function of the speed of propagation of the signal in the cable and of the signal attenuation factor.

According to a particular aspect of the invention, the control member is configured to simultaneously activate several transferometry tests for several sections of the cable by means of mutually orthogonal test signals.

According to a particular aspect of the invention, the reference signal corresponds to a measurement performed by a transferometry device at a preceding instant.

According to a particular aspect of the invention, each transferometry device comprises a means for coupling to the cable to inject and measure a signal at a point of the cable.

According to a particular aspect of the invention, the coupling means is a contactless coupler, inductive or capacitive.

According to a particular aspect of the invention, the coupling means is produced by several core toroids disposed in parallel in the vicinity of a point of the cable, each core toroid being linked to the transferometry device by a connecting wire forming several windings around the core toroid.

According to a particular aspect of the invention, the coupling means is produced by physical contact with the cable.

According to a particular aspect of the invention, the degradation indicator is proportional to the amplitude difference between the reference signal and the measured signal.

Another subject of the invention is an assembly comprising a cable and a system for monitoring the state of the cable according to the invention.

BRIEF DESCRIPTION OF THE DRAWINGS

Other features and advantages of the present invention will become more apparent on reading the following description in relation to the following attached drawings.

DETAILED DESCRIPTION

Figure 1:
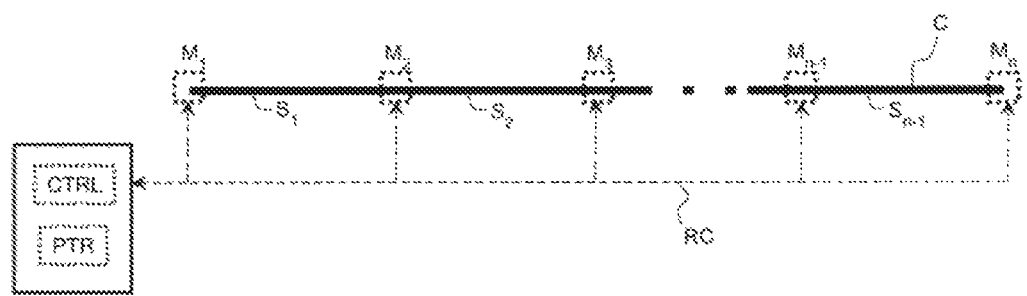
FIG. 1 represents a diagram of a system for monitoring the state of a cable of great length according to an embodiment of the invention.

FIG. 1 represents a diagram of a system for monitoring the state of a cable C according to an embodiment of the invention. The system comprises several sensors or transferometry devices $M_1$, $M_2$, $M_3$, ... $M_{n-1}$, $M_n$ disposed along the cable C at chosen points which thus delimit cable segments $S_1$, $S_2$, ... $S_{n-1}$.

Each transferometry device is configured to ensure two distinct functions: a first function of injection of a test signal into the cable C and a second function of measurement of a signal being propagated in the cable C.

To this end, each transferometry device comprises means for generating a test signal, for example a signal generator or a memory in which a digital signal is stored. The signal can be analog or digital. In the case where the signal is digital, the device also comprises a digital-analog converter.

Each device also comprises a coupler for injecting the test signal into the cable C. Advantageously, the coupler also serves to capture a signal being propagated in the cable. The coupler can be produced by physical contact or by capacitive or inductive contactless coupling.

The captured signal is digitized if necessary, via an analog-digital converter, and then transmitted, via a communication network RC, to a post-processing member PTR which is charged with analyzing the signal.

The type of test signal used can be a pulsed signal, for example a strobe or a Gaussian pulse, or a more complex signal, for example a multi-carrier signal of OMTDR (Orthogonal Multi-Tone Time Domain Reflectometry) type. The type of signal, the power of the signal injected into the cable, its frequency as well as its sampling frequency can be parameterized as a function of the nature of the cable to be monitored, notably the attenuation characteristics of the cable. These parameters depend also on the nature of the coupler used and on the accuracy desired for the measurement of the signal.

The distance between two devices $M_1$, $M_2$ depends notably on the attenuation and the dispersion of the cable and on the level of accuracy desired for the measurements. The distance between two devices $M_1$, $M_2$ is notably chosen so as to limit the level of the attenuation of the signal to a threshold value when the signal travels the path between two neighboring devices $M_1$, $M_2$. The threshold value is chosen, for example, so as to observe a minimal signal-to-noise ratio previously calculated to observe a selected link budget. Thus, the positioning of several devices along the cable C makes it possible to perform monitoring of each cable section without being dependent on the signal attenuation phenomenon.

The communication network RC can be produced by any means allowing the transmission of the signal measured by each device $M_1$, $M_2$, $M_3$, ... $M_{n-1}$, $M_n$ to a remote post-processing member PTR. For example, the communication network RC is a wired network, by optical fiber or other communication cable, or even a wireless network. In the case of a wireless network, each device $M_1$, $M_2$, $M_3$, ... $M_{n-1}$, $M_n$ is equipped with a transmitter capable of transmitting data to the post-processing member PTR and a receiver capable of receiving control information transmitted by a control member CTRL.

The function of the control member CTRL is to implement a test procedure by driving the various devices disposed along the cable. In particular, the control member CTRL transmits commands to each device to activate or deactivate the injection of a test signal into the cable and to activate or deactivate a measurement of a signal being propagated in the cable.

The control member CTRL is responsible for managing the sequencing of the activations of the various devices as a function of the signal propagation time.

With reference to FIG. 1, an example of test procedure implemented to monitor successively the state of the section $S_1$ then the state of the section $S_2$ of the cable C is described. Initially, the injection of a signal and the measurement of a signal are deactivated on all devices.

Generally, the test procedure consists in implementing the following successive steps:

the monitoring of a first section $S_1$ is activated for a first monitoring period, a second timer period is then observed, and then the monitoring of a second section $S_2$ is activated for the same first monitoring period, the steps are iterated for all sections or a set of chosen sections.

Without losing generality, the various sections $S_1, S_2, S_{n-1}$ can be of the same length or of different lengths. In the second case, the monitoring periods of each section can be adapted to the respective lengths of the sections and therefore be different. To simplify the implementation of the system, a common monitoring period can be chosen by selecting the greatest monitoring period, that is to say that which corresponds to the section of greatest length.

To perform the monitoring of the first section $S_1$, the control member CTRL transmits to the first device $M_1$ a command to activate the injection of a test signal into the cable. The injected signal is propagated in the cable to the device $M_2$. The control member CTRL transmits, simultaneously, to the second device $M_2$ a command to activate measurement of the propagated signal. The measured signal is transmitted by the device $M_2$ to the post-processing member PTR. The signal injected by the device $M_1$ continues to be propagated beyond the device $M_2$ to the device $M_3$.

When the first monitoring period has elapsed, the control member CTRL transmits to the first device $M_1$ a command to deactivate the injection of the test signal and, to the second device $M_2$, a command to deactivate the measurement.

The second timer period is determined as a function of the speed of propagation of the signal in the cable, of the length of the section of the cable under test and of a signal attenuation factor in the cable. It is notably calculated so as to take account of the time of travel of the signal injected by the first device $M_1$ until it is propagated beyond the third device $M_3$. Moreover, it is necessary to take account also of any multiple reflections of this signal on impedance discontinuities. Thus, to calculate the second timer period, a worst case situation is taken into account. A worst case is, for example, obtained by considering that reflections of the signal take place just after and just before the third device $M_3$. By considering the average power of the signal and its attenuation factor (which depends on the physical characteristics of the cable), it is possible to calculate the attenuation of the signal over time and over multiple reflections. When the attenuated signal exhibits a power (or an amplitude) below a predetermined threshold, it can be considered that its influence is negligible. The second timer period can therefore be taken to be equal to the aggregate duration of the multiple paths of the signal until the power or the amplitude of the signal becomes lower than a predetermined threshold.

More generally, the second timer period can be determined so as to take account of the margins that are sufficient to avoid interferences between the signals transmitted by two neighboring devices.

When the second timer period has elapsed, the control member CTRL activates the monitoring of the second section $S_2$. For that, it transmits to the second device $M_2$ a command to activate injection of a test signal into the cable. It also transmits to the third device $M_3$ a command to activate a measurement of the signal transmitted by the device $M_2$ and propagated to the device $M_3$.

More generally, the control member CTRL takes account of any interferences between signals injected by different devices so as to avoid them. In particular, the control member CTRL ensures that, at a given instant, one device handles either the function of injection of the test signal into the cable, or the measurement function, but not both at the same time.

The different transferometry devices do not need to be accurately synchronized with one another.

The test procedure implemented by the control member CTRL can take different forms. It can consist of a successive test of the state of each cable section $S_1, S_2 \ldots S_{n-1}$ when the objective targeted is the monitoring of all of the cable. Alternatively, it can also consist of an independent test of a cable section, for example to observe changes to a degradation detected previously.

In a variant embodiment of the invention, the control member CTRL simultaneously activates the monitoring of two or more cable sections when the distance between two sections monitored simultaneously is sufficiently great for the signal which is propagated over that distance to be sufficiently attenuated. The minimum distance between two devices is determined such that the simultaneous activation of these two devices does not generate interferences. For that, the speed of propagation of the signal in the cable, the length of the section of the cable under test, a signal attenuation factor in the cable and any reflections which the signal undergoes are taken into account.

In yet another variant embodiment of the invention, mutually orthogonal signals, for example signals coded by means of a code of CDMA (Code Division Multiple Access) type, are used. In this case, each device uses a different signal, orthogonal to all the others. Thus, it is possible to perform the simultaneous monitoring of all the sections at the same time. In this variant embodiment, the control member CTRL no longer manages the sequencing of the measurements but instead manages the distribution of the orthogonal signals between the various devices of the system.

The measurements performed are transmitted to a post-processing member PTR which performs a transferometry test to detect degradation of a cable section.

A transferometry test consists in comparing the measurement performed to a reference obtained at a preceding instant, for example corresponding to a new or healthy state of the cable.

Figure 2:
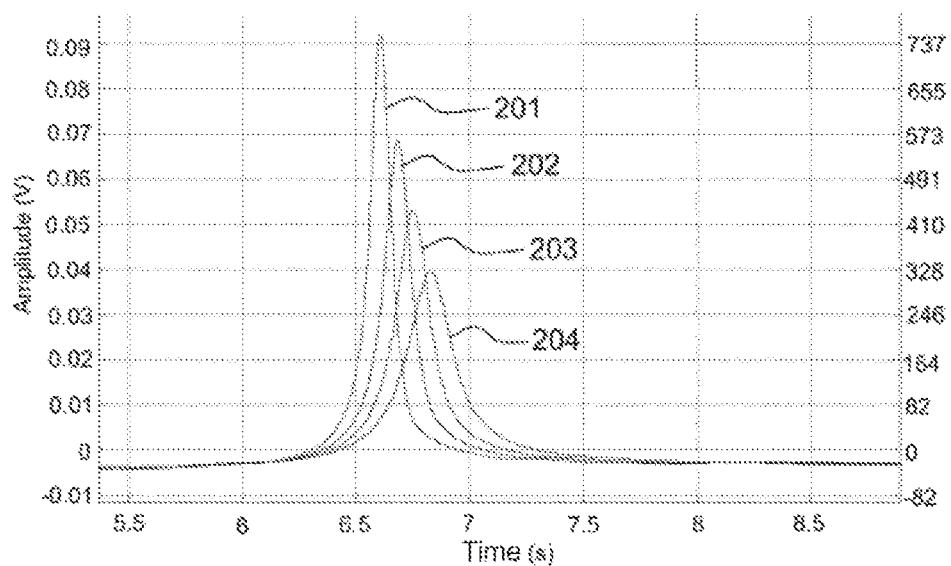
FIG. 2 represents an example of signals used by the system according to the invention to analyze the state of degradation of the cable.

FIG. 2 represents, on a diagram, an example of signals measured after their propagation between two neighboring devices $M_1, M_2$. The injected signal is a time slot. The signal 201 corresponds to a reference obtained for a healthy or non-degraded state of the cable. The signals 202,203,204 are obtained for different cable degradation levels.

A transferometry test consists, for example, in calculating the difference between the maximum of the peak of the signal obtained respectively for the current measurement and for the reference. As can be seen in FIG. 2, the more degraded the cable, the more attenuated is the signal peak. The transferometry test can take account of other characteristics of the signal, such as the width of the peak at a given amplitude level, or other, more complex criteria. The comparison is based in particular on the attenuation or the dispersion of the signal. In all cases, one objective of the transferometry test is to compare the form of the signals obtained at two different instants in order to detect a degradation of the cable between these two instants. The comparison method is, for example, based on a least squares method or on a correlation between the two signals in order to assess the differences or the resemblances between the two measurements. The reference measurement 201 can also be obtained by simulation from a modeling of the parameters of the cable.

One advantage provided by the invention is the possibility of providing information on degradation location that is limited to the resolution of a section. In other words, the invention makes it possible to locate a degraded section.

Figure 3:
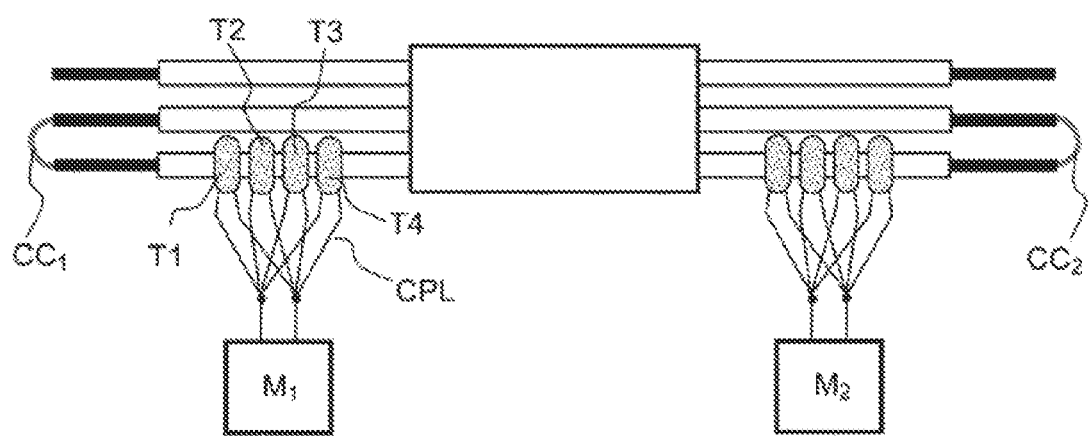
FIG. 3 represents a diagram of an example of implementation of the system according to the invention.

FIG. 3 represents, on a diagram, an exemplary embodiment of a transferometry device $M_1$, $M_2$ used to monitor the state of a conductor of a three-phase cable comprising three conductors. The ends of the cable under test are short-circuited $CC_1$, $CC_2$ with an adjacent conductor allowing current to flow between the two conductors.

This loop can be produced in different ways. A first exemplary embodiment consists in linking the core of a coaxial cable to its shielding via a resistor at each of the ends of the cable. A second exemplary embodiment consists in linking two independent conductors via short circuits $CC_1$, $CC_2$ as illustrated in FIG. 3.

In the example illustrated in FIG. 3, the coupling between each device $M_1$, $M_2$ and the cable is produced by a contactless induction coupler CPL. The induction couplers are, for example, produced by ferrite core toroids $T_1$, $T_2$, $T_3$, $T_4$ mounted in parallel in the vicinity of a point of the cable. In the example of FIG. 3, the coupler is composed of four core toroids. Each core toroid has several windings of the connecting wire which links it to the device. The number of core toroids and the number of windings is a parameter which makes it possible to adapt the gain of the coupling and its constancy in terms of frequency so as to best control the signal injected or measured.

The example of FIG. 3 can be generalized to the monitoring of all of the three conductors of the cable by positioning a coupler CPL on each conductor, or to a single cable with a single connector.

Without departing from the scope of the invention, the coupling between the cable and each device can be produced by other contactless coupling means or by a physical connection to the cable. For example, galvanic coupling can be produced by stripping the cable to place it in contact with a metal clamp linked to the device $M_1$, $M_2$.

Each transferometry device can be implemented by means of an embedded processor. The processor can be a generic processor, a specific processor, an application-specific integrated circuit (also known by the acronym ASIC) or a field-programmable gate array (also known by the acronym FPGA). The device according to the invention can use one or more dedicated electronic circuits or a general-purpose circuit. The technique of the invention can be produced on a reprogrammable computation machine (a processor or a microcontroller for example) running a program comprising a sequence of instructions, or on a dedicated computation machine (for example a set of logic gates such as an FPGA or an ASIC, or any other hardware module).

The control member CTRL and the post-processing member PTR can be implemented by means of a computer or any other equivalent computation device.

The invention claimed is:

1. A system for monitoring the state of a cable, the system comprising a plurality of transferometry devices each being capable of injecting a test signal at an injection point of the cable and measuring a signal being propagated in the cable at a measurement point of the cable, the transferometry devices being intended to be positioned along the cable at predetermined positions so as to break down the cable into successive sections, the system comprising:
a control member capable of communicating with the transferometry devices and configured so as to perform at least one transferometry test consisting in injecting a test signal into the cable with a first transferometry device and measuring the test signal after its propagation in the cable with a second transferometry device different from the first transferometry device, the system further comprising:
a post-processing member capable of communicating with the transferometry devices and configured to compare the measured signal to a reference signal to deduce therefrom an indicator of degradation of a cable section disposed between the first transferometry device and the second transferometry device, the control member being configured to control, according to a predefined test procedure, each transferometry device by activating or deactivating the injection of a test signal into the cable said each transferometry device and by activating or deactivating an acquisition of a measurement of a signal being propagated in the cable by each transferometry device,
the predefined test procedure consisting in successively executing the following commands:
activating the injection of a test signal by a first transferometry device situated at a start of a first section of the cable,
activating an acquisition of a signal measurement by a second transferometry device disposed at an end of the first section, and
after a first predetermined monitoring period, deactivating the injection of a test signal by the first transferometry device, and deactivating the acquisition of a measurement by the second transferometry device, and
after a second predetermined timer period, reiterating the predefined test procedure for the subsequent sections of the cable with, for each section, a first transferometry device situated at the start of the section and a second transferometry device disposed at the end of the section.

2. The system for monitoring the state of a cable as claimed in claim 1, wherein the first monitoring period is predetermined as a function of a speed of propagation of the signal in the cable and of a distance between two consecutive transferometry devices.

3. The system for monitoring the state of a cable as claimed in claim 2, wherein the second timer period is predetermined as a function of the speed of propagation of the signal in the cable and of a signal attenuation factor.

4. The system for monitoring the state of a cable as claimed in claim 1, wherein the reference signal corresponds to a measurement performed by a transferometry device at a preceding instant.

5. The system for monitoring the state of a cable as claimed in claim 1, wherein each transferometry device comprises a coupler for injecting and measuring a signal at a point of the cable.

6. The system for monitoring the state of a cable as claimed in claim 5, wherein the coupler is a contactless coupler, inductive or capacitive.

7. The system for monitoring the state of a cable as claimed in claim 5, wherein the coupler is produced by several core toroids disposed in parallel in a vicinity of a point of the cable, each core toroid being linked to the transferometry device by a connecting wire forming several windings around the core toroid.

8. The system for monitoring the state of a cable as claimed in claim 5, wherein the coupler is produced by physical contact with the cable.

9. The system for monitoring the state of a cable as claimed in claim 1, wherein the degradation indicator is proportional to an amplitude difference between the reference signal and the measured signal.

10. An assembly comprising a cable (C) and a system for monitoring the state of the cable as claimed in claim 1.

11. A system for monitoring a state of a cable, the system comprising a plurality of transferometry devices each being capable of injecting a test signal at an injection point of the cable and measuring a signal being propagated in the cable at a measurement point of the cable, the transferometry devices being intended to be positioned along the cable at predetermined positions so as to break down the cable into successive sections, the system comprising:
- a control member capable of communicating with the transferometry devices and configured so as to perform at least one transferometry test consisting in injecting a test signal into the cable with a first transferometry device and measuring the test signal after its propagation in the cable with a second transferometry device different from the first transferometry device, the system further comprising:
- a post-processing member capable of communicating with the transferometry devices and configured to compare the measured signal to a reference signal to deduce therefrom an indicator of degradation of a cable section disposed between the first transferometry device and the second transferometry device, the control member being configured to control, according to a predefined test procedure, each transferometry device by activating or deactivating the injection of a test signal into the cable with said device and by activating or deactivating an acquisition of a measurement of a signal being propagated in the cable with said transferometry device,
- wherein the control member is configured to simultaneously activate several tests procedures for several sections of the cable, a test procedure consisting in successively executing the following commands:
- activating the injection of a test signal by a first transferometry device situated at a start of a first section of the cable, and
- activating the acquisition of a signal measurement by a second transferometry device disposed at an end of the first section.

12. The system of claim 11 wherein the several sections of the cable are spaced apart from one another by a distance predetermined as a function of a speed of propagation of the signal in the cable and of a signal attenuation factor.

13. The system of claim 11 wherein the test signals for different simultaneous tests procedures are mutually orthogonal.

14. A system for monitoring a state of a cable, the system comprising:
- a plurality of transferometry devices each being capable of injecting a test signal at an injection point of the cable and measuring a signal being propagated in the cable at a measurement point of the cable, the transferometry devices being intended to be positioned along the cable at predetermined positions so as to break down the cable into successive sections;
- a control device configured to communicate with the transferometry devices and configured so as to perform at least one transferometry test consisting in injecting a test signal into the cable with a first transferometry device and measuring the test signal after its propagation in the cable with a second transferometry device different from the first transferometry device; and
- a post-processing device configured to communicate with the transferometry devices and configured to compare a measured signal to a reference signal to deduce therefrom an indicator of degradation of a cable section disposed between the first transferometry device and the second transferometry device, the control device being configured to control, according to a predefined test procedure, each transferometry device by activating or deactivating the injection of a test signal into the cable with said control device and by activating or deactivating an acquisition of a measurement of a signal being propagated in the cable with said transferometry device,
- wherein the control device is configured to simultaneously activate several tests procedures for several sections of the cable, a test procedure comprising successively executing the following commands:
- activating the injection of a test signal by a first transferometry device situated at a start of a first section of the cable, and
- activating the acquisition of a signal measurement by a second transferometry device disposed at an end of the first section.

15. The system of claim 14 wherein the several sections of the cable are spaced apart from one another by a distance predetermined as a function of a speed of propagation of the signal in the cable and of a signal attenuation factor.

16. The system of claim 14 wherein test signals for different simultaneous tests procedures are mutually orthogonal.

* * * * *

UNITED STATES PATENT AND TRADEMARK OFFICE
CERTIFICATE OF CORRECTION

| | | |
|---|---|---|
| PATENT NO. | : 11,906,566 B2 | |
| APPLICATION NO. | : 17/772495 | |
| DATED | : February 20, 2024 | |
| INVENTOR(S) | : Marie-Bénédicte Jacques et al. | |

It is certified that error appears in the above-identified patent and that said Letters Patent is hereby corrected as shown below:

In the Claims

In Claim 10, Column 9, Line 1, "comprising a cable (C) and a system" should be -- comprising a cable and a system --.

Signed and Sealed this
Thirtieth Day of April, 2024

Katherine Kelly Vidal
*Director of the United States Patent and Trademark Office*